United States Patent
Grover, Jr. et al.

(10) Patent No.: US 11,818,871 B2
(45) Date of Patent: Nov. 14, 2023

(54) HEAT SINK FOR AN ELECTRONIC DEVICE OF A MOTOR VEHICLE AND METHOD OF MANUFACTURING SAME

(71) Applicant: GM Global Technology Operations LLC, Detroit, MI (US)

(72) Inventors: Ronald O. Grover, Jr., Northville, MI (US); Muhammad Hussain Alvi, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 115 days.

(21) Appl. No.: 17/479,615

(22) Filed: Sep. 20, 2021

(65) Prior Publication Data

US 2023/0093466 A1 Mar. 23, 2023

(51) Int. Cl.
| | | |
|---|---|---|
| *H05K 7/20* | (2006.01) | |
| *B60R 16/03* | (2006.01) | |
| *H02M 7/00* | (2006.01) | |
| *H02M 7/537* | (2006.01) | |

(52) U.S. Cl.
CPC ............ *H05K 7/209* (2013.01); *B60R 16/03* (2013.01); *H02M 7/003* (2013.01); *H02M 7/537* (2013.01); *H05K 7/20418* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 8,081,465 | B2* | 12/2011 | Nishiura | H01L 23/3735 361/689 |
| 8,472,188 | B2* | 6/2013 | Horiuchi | H05K 7/20927 165/80.4 |
| 9,237,676 | B2* | 1/2016 | Gohara | H05K 7/20254 |
| 11,502,023 | B2* | 11/2022 | Ushijima | H05K 7/20254 |
| 2003/0053294 | A1* | 3/2003 | Yamada | H05K 7/20927 361/679.48 |
| 2008/0291628 | A1* | 11/2008 | Aoki | H01L 23/473 361/699 |
| 2008/0291710 | A1* | 11/2008 | Aoki | H02M 7/003 361/689 |
| 2009/0145581 | A1 | 6/2009 | Hoffman et al. | |
| 2014/0110834 | A1* | 4/2014 | Kusaka | H05K 7/20918 257/722 |

(Continued)

*Primary Examiner* — Courtney L Smith
(74) *Attorney, Agent, or Firm* — Vivacqua Crane PLLC

(57) ABSTRACT

An inverter assembly for a motor vehicle includes a housing with an inlet end for receiving a flow of coolant and an outlet end for discharging the flow of coolant. The assembly further includes a first plurality of power transistors conducting and switching an electrical current and generating a first amount of heat. The assembly further includes a second plurality of power transistors conducting and switching the electrical current and generating a second amount of heat that is less than the first amount of heat. A heat sink includes a plate with a first section adjacent to the first plurality of power transistors and a second section adjacent to the second plurality of power transistors. The heat sink further includes a first plurality of fins for drawing the first amount of heat from the first section and a guide vane directing the flow of coolant toward the first plurality of fins.

18 Claims, 7 Drawing Sheets

(56) References Cited

U.S. PATENT DOCUMENTS

| | | | |
|---|---|---|---|
| 2015/0061111 A1* | 3/2015 | Nagai | H01L 23/46 |
| | | | 257/714 |
| 2017/0271240 A1* | 9/2017 | Inoue | H01L 23/473 |
| 2017/0332522 A1* | 11/2017 | Ushijima | H01L 23/473 |
| 2022/0173012 A1* | 6/2022 | Ushijima | H05K 7/20 |

* cited by examiner

HEAT SINK FOR AN ELECTRONIC DEVICE OF A MOTOR VEHICLE AND METHOD OF MANUFACTURING SAME

INTRODUCTION

The present disclosure relates to a heat sink for an electronic device of a motor vehicle, and more particularly to a heat sink that reduces a demand on a coolant pump or fan and includes a guide vane for directing coolant to fins that draw heat from a portion of the electronic device with the highest temperature.

Modern Electric Vehicles (EVs) can include inverters with power electronic modules (PE modules) and heat sinks for cooling the PE modules. The heat sink can be an active or passive heat exchanger that transfers the heat generated by the PE module to a fluid medium, e.g., air or a liquid coolant, where it is dissipated away from the PE module. The heat sink includes a base attached to the PE module for conducting heat from the PE module, and the heat sink further includes a plurality of fins that extend from the base and transfer heat from the base to the flow of coolant. One example of the heat sink includes a pin-fin heat sink with each fin formed in a cylindrical pin shape. Another example of the heat sink includes a plate-fin heat sink with each fin formed in a flat plate shape. The PE module can have certain chips positioned in a central region, where they are surrounded by other chips. The chips positioned in the central region may receive heat generated by surrounding chips, such that those chips operate at higher temperatures than the other chips, which in turn causes the chips to operate inefficiently and generate additional heat. The uniform pin density of the heat sink can result in insufficient cooling of the chips, which are positioned in the central region and/or generate more heat than other chips of the PE module. Where the coolant pump or fan speed is increased to avoid overheating of any portion of the PE module, the uniform pin density can cause unnecessary cooling of a chips spaced from the central region of the PE module and/or chips that generate less heat than the other portions of the PE module. Furthermore, the density of the fins can cause a pressure drop in coolant flow across the heat sink, which can in turn demand that an associated amount of power be supplied to the coolant pump or fan.

Thus, while existing heat sinks achieve their intended purpose, there is a need for a new and improved heat sink that addresses these issues so as to increase a life cycle of the electronic device and decrease demands on the coolant pump.

SUMMARY

According to several aspects of the present disclosure, an inverter assembly for a motor vehicle includes a housing with an inlet end for receiving a flow of coolant and an outlet end for discharging the flow of coolant from the housing. The assembly further includes a first plurality of power transistors mounted to the housing, with the first plurality of power transistors conducting and switching an electrical current and generating a first amount of heat. The assembly further includes a second plurality of power transistors mounted to the housing, with the second plurality of power transistors conducting and switching the electrical current and generating a second amount of heat that is less than the first amount of heat. The assembly further includes a heat sink mounted to the housing. The heat sink includes a plate having a first section positioned adjacent to the first plurality of power transistors to draw the first amount of heat from the first plurality of power transistors and a second section positioned adjacent to the second plurality of power transistors to draw the second amount of heat from the second plurality of power transistors. The heat sink further includes a first plurality of fins extending from the first section of the plate to draw the first amount of heat from the first section. The heat sink further includes a guide vane extending from the plate and directing the flow of coolant toward the first plurality of fins extending from the first section of the plate.

In one aspect, the heat sink further includes a second plurality of fins that extend from the second section of the plate, with the guide vane directing the flow of coolant away from the second plurality of fins.

In another aspect, the wherein the housing extends along a longitudinal axis from the inlet end to the outlet end, with the first plurality of fins positioned on one side of the longitudinal axis and the second plurality of fins are positioned on the other side of the longitudinal axis.

In another aspect, the guide vane is a non-linear flange extending from the plate.

In another aspect, the non-linear flange extending from the plate has an arcuate shape.

In another aspect, the guide vane is a linear flange extending from the plate and positioned at an angle relative to the longitudinal axis.

In another aspect, the plate further includes a third section positioned downstream of the inlet end and upstream of the first and second sections of the plate, with the third section being free of the first plurality of fins and the second plurality of fins.

In another aspect, the assembly further includes a third plurality of power transistors mounted to the housing and positioned adjacent to the third section of the plate, with third plurality of power transistors conducting and switching the electrical current and generating a third amount of heat that is less than the first amount of heat.

According to several aspects of the present disclosure, an inverter assembly for a motor vehicle includes a housing having an inlet end for receiving a flow of coolant and an outlet end for discharging the flow of coolant from the housing. The assembly further includes a first plurality of power transistors mounted to the housing, with the first plurality of power transistors conducting and switching an electrical current and generating a first amount of heat. The assembly further includes a second plurality of power transistors mounted to the housing, with the second plurality of power transistors conducting and switching the electrical current and generating a second amount of heat that is less than the first amount of heat. The assembly further includes a heat sink mounted to the housing, with the heat sink including a plate. The plate has a first section positioned adjacent to the first plurality of power transistors to draw the first amount of heat from the first plurality of power transistors and a second section positioned adjacent to the second plurality of power transistors to draw the second amount of heat from the second plurality of power transistors, The heat sink further includes a first plurality of fins extending from the first section of the plate to draw the first amount of heat from the first section, with each of the first plurality of fins having a frustum pin shape. The heat sink further includes a guide vane extending from the plate and directing the flow of coolant toward the first plurality of fins extending from the first section of the plate.

In one aspect, the heat sink further includes a second plurality of fins that extend from the second section of the plate, with the guide vane directing the flow of coolant away from the second plurality of fins, and each of the second plurality of fins having the frustum pin shape.

In another aspect, the frustum pin shape extends along a pin axis, and the frustum pin shape has a surface positioned at a draft angle in a range between 7 degrees and 9 degrees relative to the pin axis.

In another aspect, the first plurality of fins and the second plurality of fins are arranged in a staggered pattern relative to one another.

In another aspect, the housing extends along a longitudinal axis from the inlet end to the outlet end, with the first plurality of fins positioned on one side of the longitudinal axis and the second plurality of fins positioned on the other side of the longitudinal axis.

In another aspect, the guide vane is a non-linear flange extending from the plate.

In another aspect, the non-linear flange extending from the plate has an arcuate shape.

In another aspect, the plate further includes a third section positioned downstream of the inlet end and upstream of the first and second sections of the plate, with the third section being free of the first plurality of fins and the second plurality of fins.

In another aspect, the assembly further includes a third plurality of power transistors mounted to the housing and positioned adjacent to the third section of the plate, with third plurality of power transistors conducting and switching the electrical current and generating a third amount of heat that is less than the first amount of heat.

According to several aspects of the present disclosure, a method, executed by a computer having a non-transitory computer readable storage medium storing instructions and at least one processor, is provided for manufacturing an inverter assembly for a motor vehicle. The method includes simulating, using the at least one processor, a virtual inverter assembly to determine a thermal performance of the virtual inverter assembly. The virtual inverter assembly includes a housing extending along a longitudinal axis with an inlet end for receiving a flow of coolant and an outlet end for discharging the flow of coolant from the housing. The virtual inverter assembly further includes a first plurality of power transistors mounted to the housing, with the first plurality of power transistors conducting and switching an electrical current and generating a first amount of heat. The virtual inverter assembly further includes a second plurality of power transistors mounted to the housing, with the second plurality of power transistors conducting and switching the electrical current and generating a second amount of heat. The virtual inverter assembly further includes a heat sink mounted to the housing. The heat sink includes a plate having a first section positioned adjacent to the first plurality of power transistors to draw the first amount of heat from the first plurality of power transistors and a second section positioned adjacent to the second plurality of power transistors to draw the second amount of heat from the second plurality of power transistors. The heat sink further includes a first plurality of fins extending from the first section of the plate to draw the first amount of heat from the first section. The heat sink further includes a second plurality of fins extending from the second section of the plate to draw the second amount of heat from the second section. The heat sink further includes a guide vane extending from the plate and directing the flow of coolant toward the first plurality of fins or the second plurality of fins. The method further includes determining, using the processor, a temperature gradient between the first plurality of fins and the second plurality of fins. The method further includes comparing, using the at least one processor, the temperature gradient to a gradient threshold. The method further includes positioning, using the processor, the guide vane at a new position based on the temperature gradient to form a new virtual inverter assembly, in response to the computer determining that the temperature gradient is above the gradient threshold. The method further includes simulating, using the processor, the new virtual inverter assembly to determine the thermal performance of the new virtual inverter assembly, in response to the computer forming the new virtual inverter assembly. The method further includes forming the inverter assembly based on the new virtual inverter assembly, in response to the computer determining that the temperature gradient is below the gradient threshold.

In one aspect, the method further includes positioning, using the processor, the guide vane at predetermined angular position relative to the longitudinal axis, in response to the computer determining that the temperature gradient is above the gradient threshold.

In another aspect, the method further includes comparing, using the processor, a fin temperature of each of the fins, to a predetermined temperature threshold. The method further includes omitting, using the processor, a third plurality of fins from a third section of the plate to form a new virtual inverter assembly, in response to the computer determining that the fin temperature of the associated fins is below the predetermined temperature threshold. The method further includes simulating, using the processor, the new virtual inverter assembly to determine the thermal performance of the new virtual inverter assembly, in response to the computer forming the new virtual inverter assembly. The method further includes forming the inverter assembly based on the new virtual inverter assembly, in response to the computer determining that the fin temperature of each of the first plurality of fins and the second plurality of fins is above the predetermined temperature threshold.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
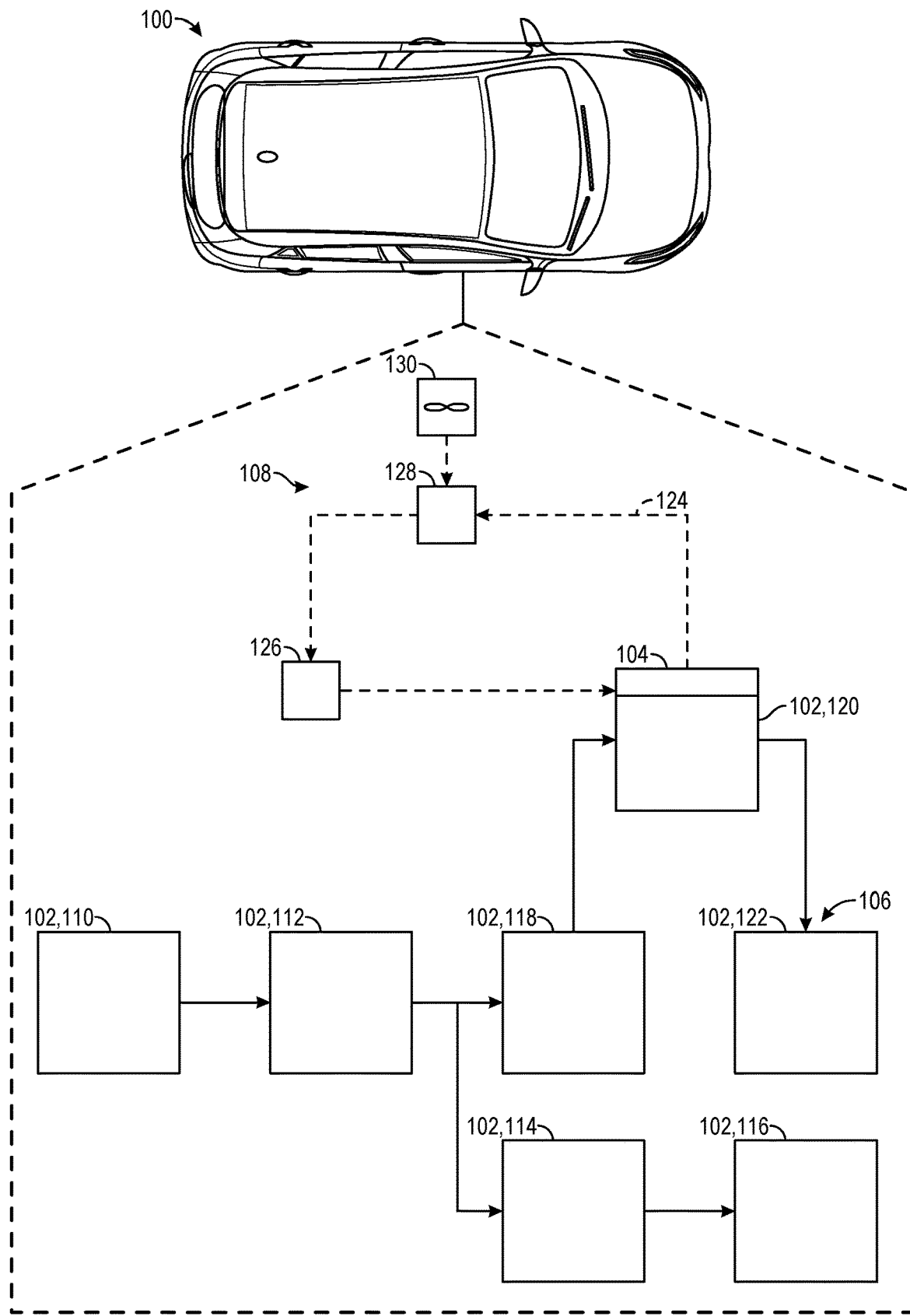
FIG. 1 is a schematic representation of one example of a motor vehicle having a propulsion system with an inverter assembly.

The following description is merely exemplary in nature and is not intended to limit the present disclosure, application, or uses. Although the drawings represent examples, the drawings are not necessarily to scale and certain features may be exaggerated to better illustrate and explain a particular aspect of an illustrative example. Any one or more of these aspects can be used alone or in combination within one another. Further, the exemplary illustrations described herein are not intended to be exhaustive or otherwise limiting or restricting to the precise form and configuration shown in the drawings and disclosed in the following detailed description. Exemplary illustrations are described in detail by referring to the drawings as follows:

Referring to FIG. 1, one non-limiting example of a motor vehicle 100 having an electronic component 102 includes a heat sink 104 (FIG. 2) that efficiently cools the electronic component 102 and prevents damage to the electronic component 102 associated with overheating. The motor vehicle 100 can be an electric land vehicle, such as a car or a truck, with a propulsion system 106 and a thermal system 108. In this non-limiting example, the propulsion system 106 can include multiple electronic components 102, such as a battery charger 110, a high voltage battery 112, a DC-DC converter 114, one or more ancillary loads 116, a bi-directional converter 118, an inverter assembly 120, and an electric motor 122 for delivering power to the wheels for propelling the vehicle and/or charging the battery 112. The thermal system 108 includes a coolant loop 124, a pump 126 for pumping a coolant through the coolant loop 124, a heat sink 104 attached to the inverter assembly 120 for transferring heat from a power electronic module 132 (PE module) to the flow of coolant, a radiator 128 for transferring heat from the coolant to air surrounding the vehicle 100, and a fan 130 for directing flow of air through the radiator 128. It is contemplated that the motor vehicle 100 can include other examples of systems with other suitable electronic components having the heat sink.

Figure 2:
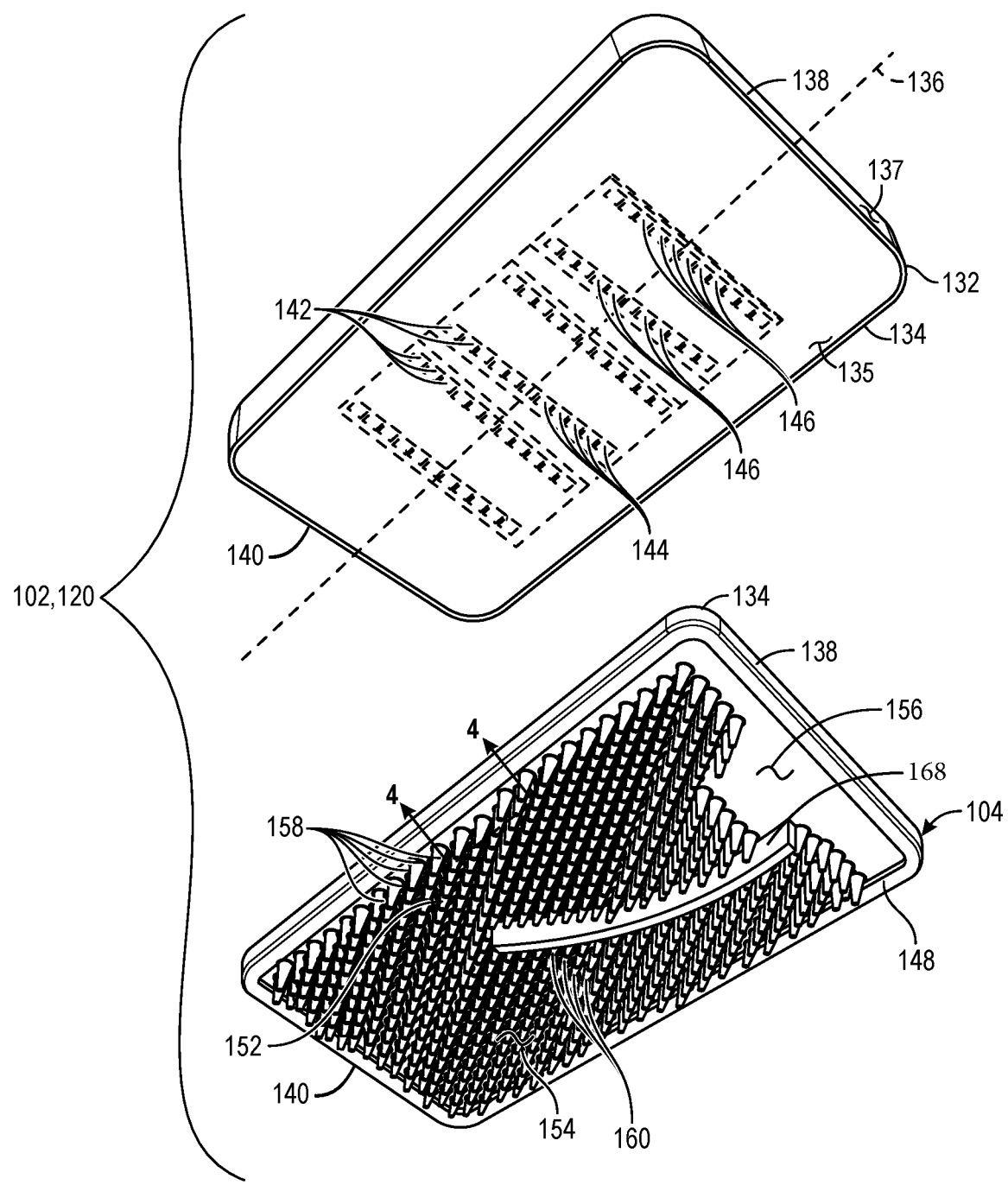
FIG. 2 is an exploded bottom perspective view of the inverter assembly of FIG. 1, illustrating the inverter assembly having one example of a heat sink and a power electronic module having an associated plurality of transistors.
Figure 3:
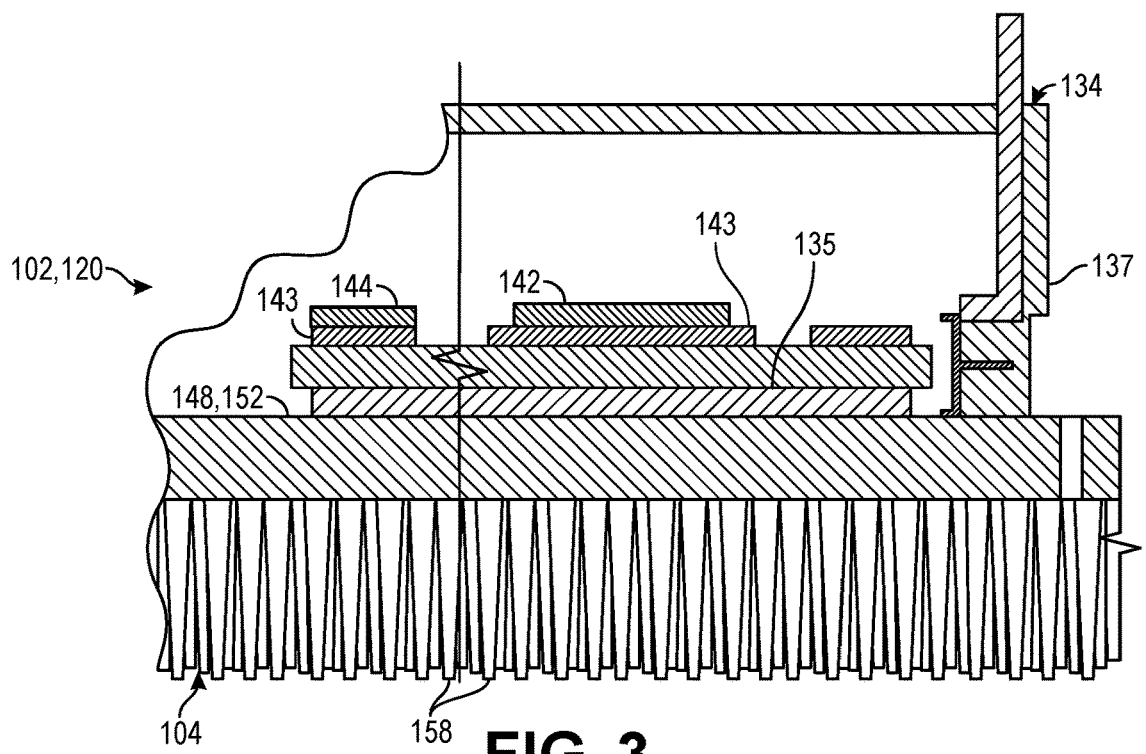
FIG. 3 is a cross-sectional view of the inverter assembly of FIG. 2 as taken along line 3-3.

Referring to FIGS. 2 and 3, the inverter assembly 120 includes the PE module 132 for converting the High-Voltage system DC voltage into 3 AC output phases to drive the motor 122 (FIG. 1). In this non-limiting example, the PE module 132 includes a housing 134 extending along a housing axis 136 with an inlet end 138 on one end for receiving a flow of coolant and an outlet end 140 on the other end for discharging the flow of coolant from the housing 134. As best shown in FIG. 3. in this non-limiting example, the housing 134 includes a baseplate 135 and a plurality of sidewalls 137 extending from the baseplate 135. The PE module 132 includes a first plurality of power transistors 142 or semiconductors mounted to a direct bonded copper substrate 143 (DBC substrate) that is in turn attached to the baseplate 135 of the housing 134, with the first plurality of power transistors 142 conducting and switching an electrical current and generating a first amount of heat. The PE module 132 further includes a second plurality of power transistors 144 or semiconductors mounted to the DBC substrate 143 that is in turn attached to the baseplate 135 of the housing 134, with the second plurality of power transistors 144 conducting and switching the electrical current and generating a second amount of heat that is less than the first amount of heat. The PE module 132 further includes a third plurality of power transistors 146 or semiconductors mounted to the DBC substrate 143 that is in turn attached to the baseplate 135 of the housing 134, with third plurality of power transistors 146 conducting and switching the electrical current and generating a third amount of heat that is less than the first amount of heat. In other examples, it is contemplated that any of the power transistors can be mounted to the DBC substrate that is in turn mounted directly to the plate of the heat sink. Furthermore, in some cases the heat generated by the power transistors 142, 144, 146 might be equal to one another but the power transistors positioned in a central region of the PE module have a higher temperature than the other power transistors because the power transistors in the central region are surrounded by the other power transistors that also generate heat and those power transistors having a smaller heat path. It is contemplated that any one or more of the first plurality of power transistors 142, the second plurality of power transistors 144, and the third plurality of power transistors 146 can be a silicon insulated gate bipolar transistor (IGBT), a silicon carbide (SiC) metal-oxide semiconductor field effect transistor (MOSFET), a silicon (Si) superjunction MOSFET, a Gallium nitride (GaN) field-effect transistor (FET), a SiC junction-gate field-effect transistor (JFET), other wideband-gap (WBG) or ultra-wideband-gap semiconductor power switching devices (UWBG), or other suitable switch having a corresponding gate to which a gate signal is applied to change the on/off state of a given switch.

Figure 4:
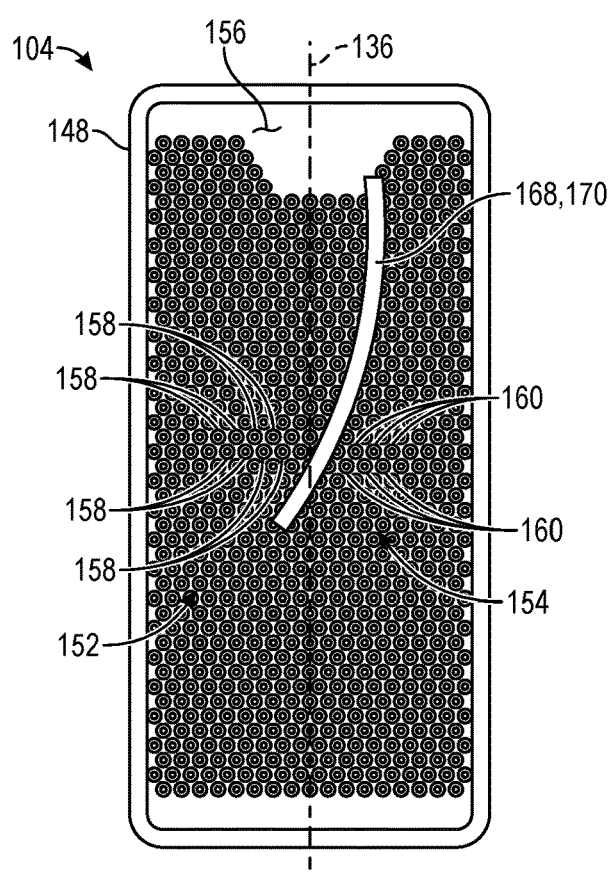
FIG. 4 is a bottom plan view of the inverter assembly of FIG. 2, illustrating the heat sink having a plate, a plurality of fins, and a guide vane.

Referring to FIG. 4, the assembly 120 further includes a heat sink 104 mounted to the housing 134, with the heat sink 104 including a plate 148. In this non-limiting example, the plate 148 is an integral portion of the housing, e.g. a stack up panel with the transistors 142, 144, 146 mounted directly to the plate 148 and the plate 148 being attached to one or more sidewalls 137 of the housing 134. The plate 148 has a first section 152 positioned adjacent to the first plurality of power transistors 142 to draw the first amount of heat from the first plurality of power transistors 142 and a second section 154 positioned adjacent to the second plurality of power transistors 144 to draw the second amount of heat from the second plurality of power transistors 144. The first and second sections 152, 154 of the plate 148 are positioned on opposite sides of a common length of the axis 136. The plate 148 further has a third section 156 positioned adjacent to the third plurality of power transistors 146 to draw the third amount of heat from the third plurality of power transistors 146. The third section 156 is positioned immediately downstream of the inlet end 138 and upstream of the first and second sections 152, 154 of the plate 148, with at least a portion of the third section 156 being free of a first plurality of fins 158 and a second plurality of fins 160 as described in detail below. In other examples, the plate of the heat sink can be separate from the housing and interface with a panel of the housing upon which the transistors are mounted. It is contemplated that heat can be more quickly dissipated from the transistors when the transistors are mounted directly to the plate of the heat sink.

The heat sink 104 further includes a first plurality of fins 158 extending from the first section 152 of the plate 148 to draw the first amount of heat from the first section 152. The heat sink 104 further includes a second plurality of fins 160 that extend from the second section 154 of the plate 148. The first plurality of fins 158 are positioned on one side of the housing axis 136 of the heat sink 104, and the second plurality of fins 160 are positioned on the other side of the housing axis 136.

Figure 5:
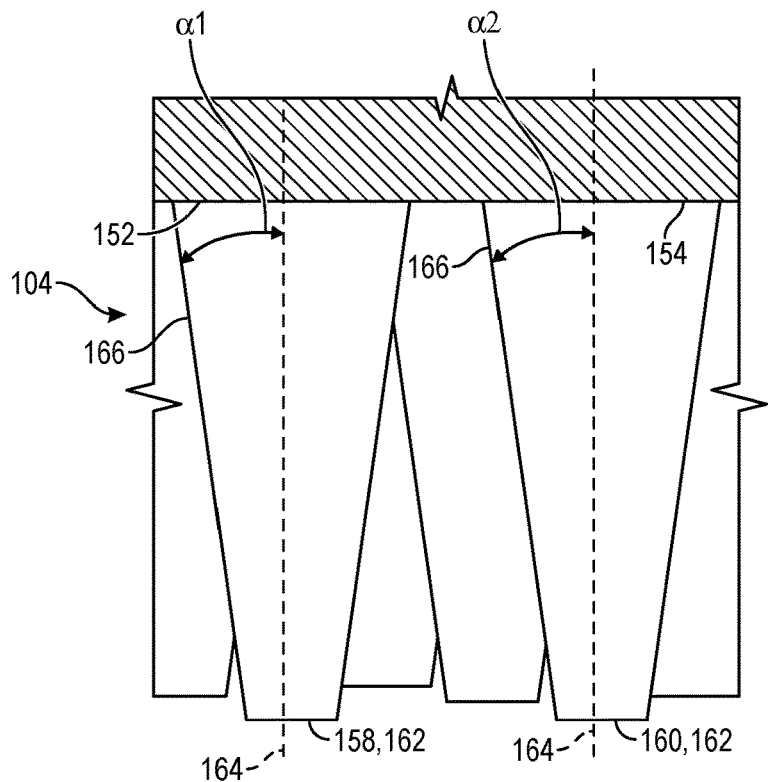
FIG. 5 is an enlarged side view of a portion of the heat sink of FIG. 4, illustrating each of the fins having a frustum pin shape.

As best shown in FIG. 5, each of the first plurality of fins 158 and the second plurality of fins 160 has a frustum pin shape 162 extending along a pin axis 164, and the frustum pin shape 162 has a surface 166 positioned at an associated draft angle $\alpha1$, $\alpha2$ relative to the pin axis 164 in a range between 7 degrees and 9 degrees. In this non-limiting example, the draft angle $\alpha1$ of the surface 166 of the first plurality of fins 158 is 9 degrees, and the draft angle $\alpha2$ of the surface 166 of the second plurality of fins 160 is 7 degrees. It is contemplated that either one of the draft angles $\alpha1$, $\alpha2$ can be less than 7 degrees or more than 9 degrees. In another non-limiting example, the surfaces of the first plurality of fins and the second plurality of fins can be positioned at a common draft angle. It is understood that the draft angle, the frustum pin shape of the fins, and the absence of fins on the third section 156 adjacent to the inlet end 138 can minimize the pressure drop in the coolant across the heat sink 104, such that the power demand on the coolant pump 126 can in turn be minimized.

Referring back to FIG. 4, each of the first plurality of fins 158 and the second plurality of fins 160 are arranged in a staggered pattern relative to one another. The staggered pattern can cause the coolant to swirl and flow along the surface of each fin to facilitate with the transfer of heat from the fins to the coolant. In other non-limiting examples, the fins can be arranged in non-staggered linear rows and columns. It is also contemplated that other examples of the heat sink can have fins extending from the third section.

The heat sink 104 further includes a guide vane 168 extending from the plate 148, and the guide vane 168 directs the flow of coolant toward the first plurality of fins 158 and away from the second plurality of fins 160. In this non-limiting example, the guide vane 168 is a non-linear flange 170 extending from the plate 148, and the non-linear flange 170 has an arcuate shape.

Figure 6:
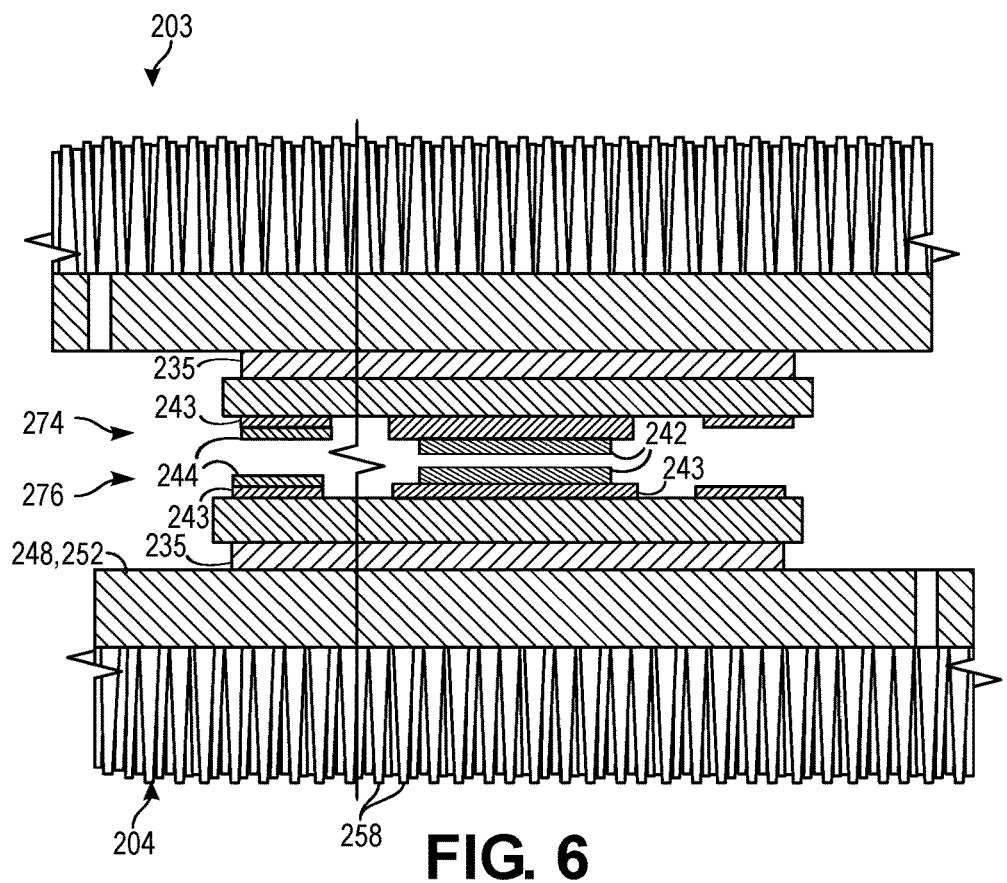
FIG. 6 is a cross-sectional view of another example of the inverter assembly of FIG. 2 as taken along line 4-4, illustrating the inverter assembly including upper and lower heat sinks attached to associated upper and lower layers of transistors.

Referring to FIG. 6, another example of an inverter assembly 220 is similar to the inverter assembly 120 of FIG. 4 and has similar components identified by the same numbers increased by 100. However, while the inverter assembly 120 of FIG. 4 includes a single layer of transistors mounted directly to a single heat sink 104, the inverter assembly 220 includes upper and lower layers of transistors 274, 276 mounted to associated upper and lower heat sinks 203, 204.

Figure 7:
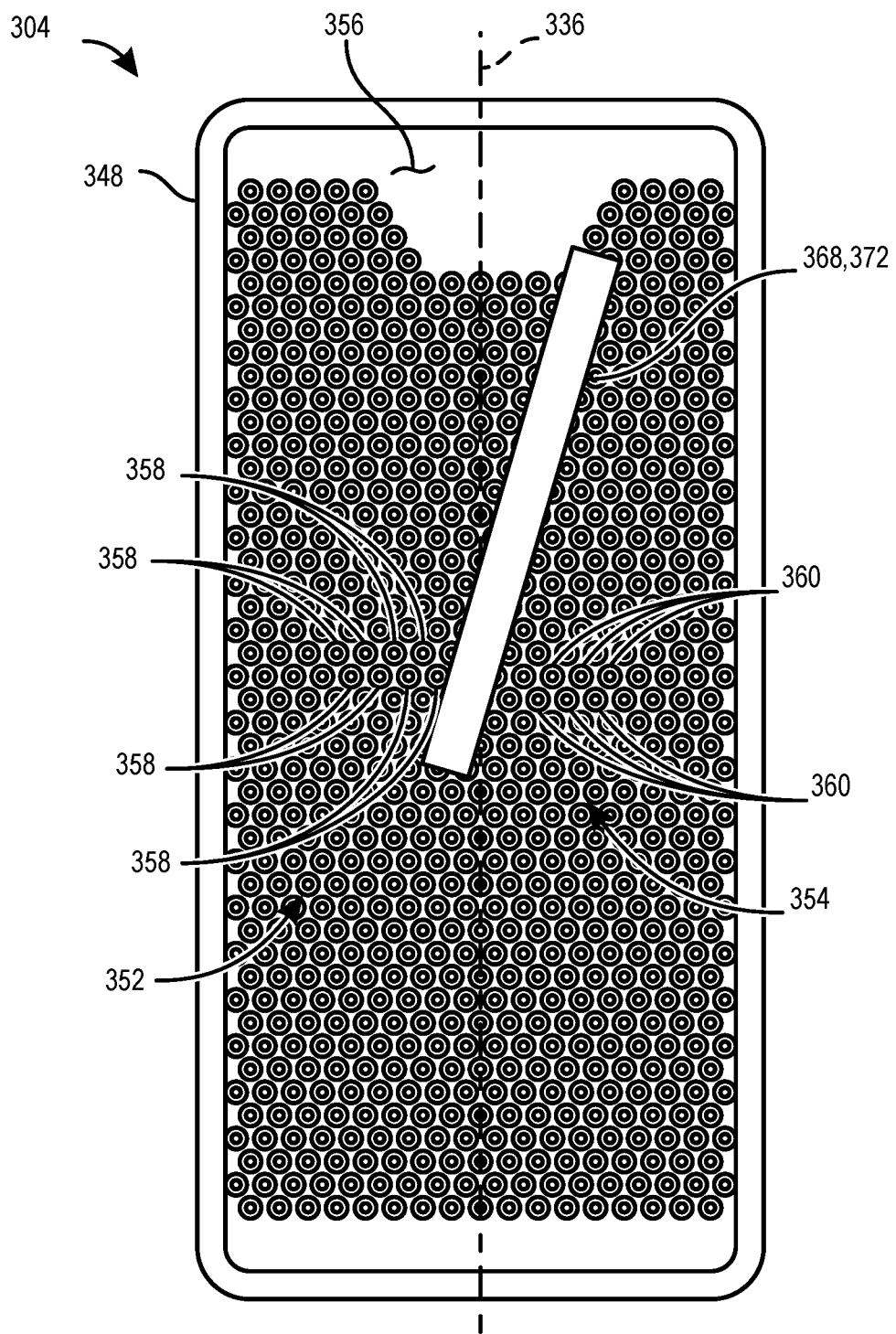
FIG. 7 is a bottom plan view of another example of the heat sink of FIG. 3, illustrating the heat sink having a guide vane formed in a linear flange.

Referring to FIG. 7, another example of a heat sink 304 is similar to the heat sink 104 of FIG. 3 and has the similar components identified by the same reference numbers increased by 200. However, while the heat sink 104 of FIG. 3 has the guide vane 168 in the form of the non-linear flange 170, the heat sink 368 has a guide vane 368 in the form of a linear flange 372. It is contemplated that the heat sink can include any number of guide vanes in the form of any suitable shape.

Figure 8:
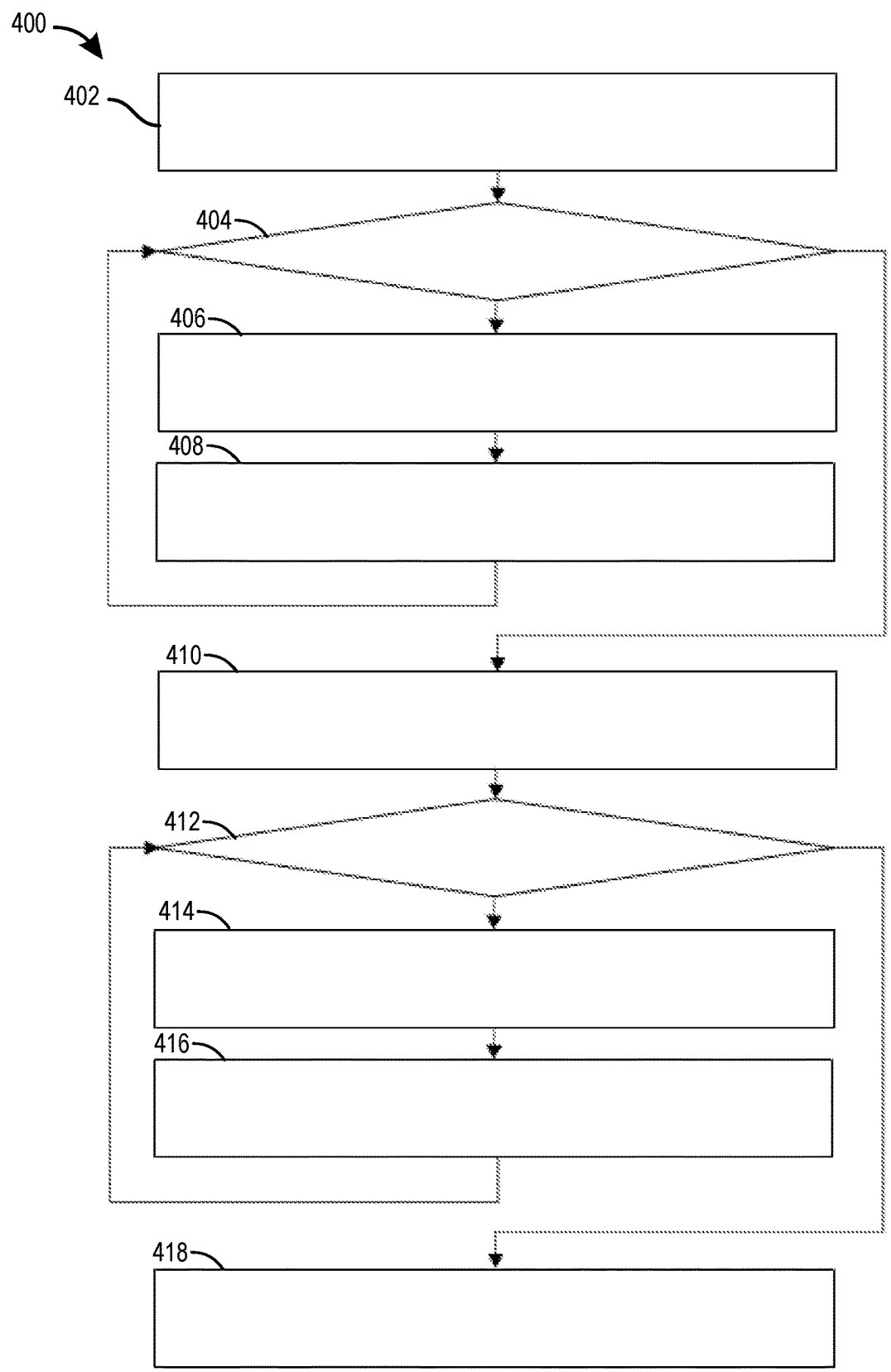
FIG. 8 is a flow chart of one example of a method of using a computer for manufacturing the inverter assembly with the heat sink of FIG. 7.
Figure 9:
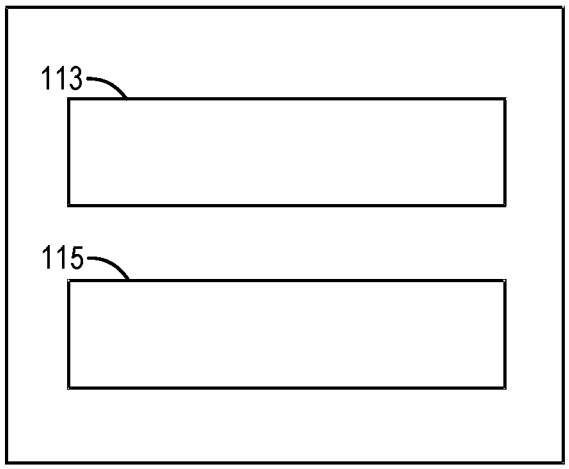
FIG. 9 is a schematic representation of the computer of FIG. 8, illustrating the computer having a non-transitory computer readable storage medium and at least one processor.

Referring to FIG. 8, an example of a method 400 is provided for manufacturing an inverter assembly with the heat sink 304 of FIG. 7. The method 400 begins at block 402 with a computer 111 (FIG. 9) having a non-transitory computer readable storage medium 113 storing instructions such that at least one processor 115 is programmed to simulate a virtual inverter assembly to determine a thermal performance of the virtual inverter assembly. The virtual inverter assembly includes a housing extending along a longitudinal axis with an inlet end for receiving a flow of coolant and an outlet end for discharging the flow of coolant from the housing. The virtual inverter assembly further includes a plurality of power transistors mounted to the housing and a heat sink with a plurality of fins that are positioned adjacent to the power transistors. More specifically, in this non-limiting example, the virtual inverter assembly further includes a first plurality of power transistors mounted to the housing, with the first plurality of power transistors conducting and switching an electrical current and generating a first amount of heat. The virtual inverter assembly further includes a second plurality of power transistors mounted to the housing, with the second plurality of power transistors conducting and switching the electrical current and generating a second amount of heat. The virtual inverter assembly further includes a third plurality of power transistors mounted to the housing, with the third plurality of power transistors conducting and switching the electrical current and generating a second amount of heat. The virtual inverter assembly further includes a heat sink mounted to the housing, with the heat sink including a plate. The plate has a first section positioned adjacent to the first plurality of power transistors to draw the first amount of heat from the first plurality of power transistors. The plate further has a second section positioned adjacent to the second plurality of power transistors to draw the second amount of heat from the second plurality of power transistors. The plate further has a third section positioned adjacent to the third plurality of power transistors to draw the third amount of heat from the third plurality of power transistors. The heat sink further includes a first plurality of fins extending from the first section of the plate to draw the first amount of heat from the first section. The heat sink further includes a second plurality of fins extending from the second section of the plate to draw the second amount of heat from the second section. The heat sink further includes a third plurality of fins extending from the third section of the plate to draw the third amount of heat from the third section. The heat sink further includes a guide vane extending from the plate and directing the flow of coolant toward the first plurality of fins or the second plurality of fins.

At block 404, the processor 115 compares a fin temperature of each of the fins to a predetermined temperature threshold, e.g., 70 degrees C. Continuing with the previous non-limiting example, the first plurality of fins and the second plurality of fins, which are positioned adjacent to the outlet end of the housing, have a fin temperature above the predetermined temperature threshold, and the third plurality of fins, which are positioned adjacent to the inlet end of the housing, have a fin temperature that is below the predetermined temperature threshold. However, it is contemplated that a fin positioned on any portion of the plate can have a fin temperature that is above or below the predetermined temperature threshold. If the fin temperature of any of the fins is below the predetermined temperature threshold, the method proceeds to block 406. If the fin temperature of all of the fins is above the predetermined temperature threshold, the method proceeds immediately to block 410.

At block 406, the processor 115 omits each of the fins having a fin temperature below the predetermined temperature threshold to form a new virtual inverter assembly. Continuing with the previous example, the computer omits the third plurality of fins, in response to the computer determining that the third plurality of fins has a temperature that is below 70 degrees C.

At block 408, the processor 115 simulates the new virtual inverter assembly to determine the thermal performance of the new virtual inverter assembly. The method returns to block 404.

At block 410, the processor 115 determines a temperature gradient between the first plurality of fins and the second plurality of fins.

At block 412, the processor 115 compares the temperature gradient to a predetermined gradient threshold. If the temperature gradient is above the gradient threshold, the method 400 proceeds to block 414. If the temperature gradient is below the gradient threshold, the method 400 immediately proceeds to block 418.

At block 414, the processor 115 positions the guide vane at a new position relative to the longitudinal axis based on the temperature gradient to form a new virtual inverter assembly. In this non-limiting example, the computer can position a linear guide vane at a predetermined angular position relative to the longitudinal axis such that the angular position is in a direct linear relationship with the temperature gradient. More specifically, the computer can position the guide vane such that the guide vane is angularly spaced five degrees relative to the longitudinal axis to direct the flow of coolant to the first plurality of fins when the first plurality of fins has a temperature that is five degrees C. higher than a temperature of the second plurality of fins. It is contemplated that the computer At block 416, the processor 115 simulates the new virtual inverter assembly to determine the thermal performance of the new virtual inverter assembly, in response to the computer forming the new virtual inverter assembly. The method returns to block 410.

At block 418, the inverter assembly 320 is formed based on the new virtual inverter assembly. Non-limiting examples of manufacturing the heat sink 304 based on the new virtual inverter assembly can include 3D printing, extrusion, cold forging, casting, stamping, skiving, swaging, and/or CNC machining. The first and second sections with the associated first plurality of fins and the second plurality of fins are positioned adjacent to the first plurality of power transistors and the second plurality of power transistors, respectively.

Figure 10:
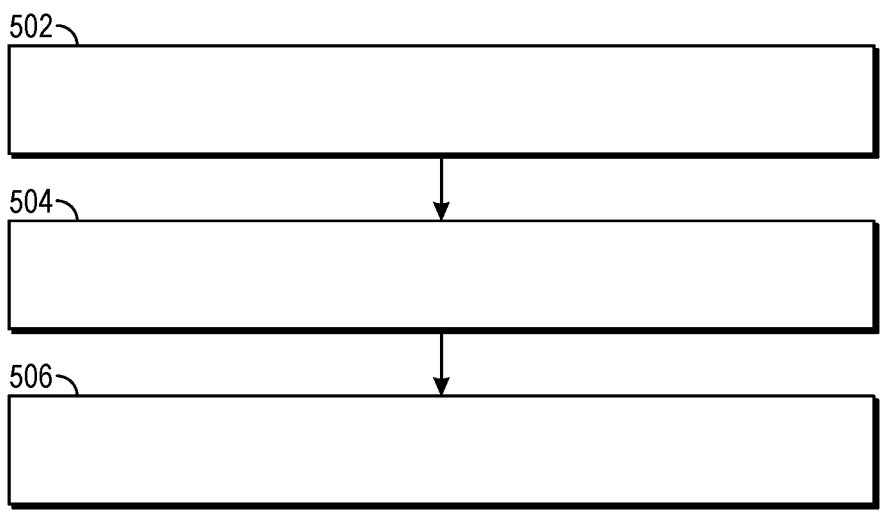
FIG. 10 is a flow chart of one example of a method of manufacturing the inverter assembly of FIG. 1.

Referring to FIG. 10, an example of a method 500 is provided for operating the inverter assembly 120 of FIG. 2. The method 500 begins at block 502 with the first plurality of power transistors 142 and the second plurality of power transistors conducting and switching an electrical current, with the first plurality of power transistors 142 generating a first amount of heat and the second plurality of power transistors generating a second amount of heat that is less than the first amount of heat.

At block 504, the first section 152 of the plate 148 draws heat from the first plurality of power transistors 142, and the first plurality of fins 158 draws heat from the first section 152 of the plate 148. The frustum pin shape 162 of each of the first plurality of fins 158 transfers heat to the flow of coolant, such that pressure drop in the coolant flow across the heat sink 104 is minimized.

At block 506, the guide vane 168 directs the flow of coolant from the inlet end 138 to the first plurality of fins 158 and away from the second plurality of fins 160.

In general, the computer described above described may employ any number of computers with computer operating systems, including, but by no means limited to, versions and/or varieties of the ANDROID AUTOMOTIVE OS developed by GOOGLE INC., the MICROSOFT WINDOWS operating system, the UNIX operating system (e.g., the SOLARIS operating system distributed by ORACLE Corporation of Redwood Shores, California), the AIX UNIX operating system distributed by INTERNATIONAL BUSINESS MACHINES of Armonk, New York, the LINUX operating system, the MAC OSX and iOS operating systems distributed by APPLE INC. of Cupertino, California, the BLACKBERRY OS distributed by BLACKBERRY LTD. of Waterloo, Canada, and the OPEN HANDSET ALLIANCE, or the QNX CAR Platform for Infotainment offered by QNX Software Systems. Examples of computing devices include, without limitation, an on board vehicle computer, a computer workstation, a server, a desktop, notebook, laptop, or handheld computer, or some other computing system and/or device.

Computers and computing devices generally include computer executable instructions, where the instructions may be executable by one or more computing devices such as those listed above. Computer executable instructions may be compiled or interpreted from computer programs created using a variety of programming languages and/or technologies, including, without limitation, and either alone or in combination, JAVA, C, C++, MATLAB, SIMULINK, STATEFLOW, VISUAL BASIC, JAVA SCRIPT, PERL, HTML, TENSORFLOW, PYTORCH, KERAS, etc. Some of these applications may be compiled and executed on a virtual machine, such as the JAVA VIRTUAL MACHINE, the DALVIK virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random-access memory, etc.

The CRM that participates in providing data (e.g., instructions) may be read by the computer (e.g., by a processor of a computer and may take many forms, including, but not limited to, non-volatile media and volatile media. Non-volatile media may include, for example, optical or magnetic disks and other persistent memory. Volatile media may include, for example, dynamic random-access memory (DRAM), which typically constitutes a main memory. Such instructions may be transmitted by one or more transmission media, including coaxial cables, copper wire and fiber optics, including the wires that comprise a system bus coupled to a processor of an ECU. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the media, processes, systems, methods, heuristics, etc. described herein, it should be understood that, although the steps of such processes, etc. have been described as occurring according to a certain ordered sequence, such processes may be practiced with the described steps performed in an order other than the order described herein. It further should be understood that certain steps may be performed simultaneously, that other steps may be added, or that certain steps described herein may be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An inverter assembly for a motor vehicle, the inverter assembly comprising:
    a housing having an inlet end for receiving a flow of coolant and an outlet end for discharging the flow of coolant from the housing, wherein the inlet end is disposed on the housing opposite the outlet end along a longitudinal axis of the housing;
    a first plurality of power transistors mounted to the housing between the inlet end and the outlet end, with the first plurality of power transistors conducting and switching an electrical current and generating a first amount of heat;
    a second plurality of power transistors mounted to the housing between the inlet end and the outlet end, with the second plurality of power transistors conducting and switching the electrical current and generating a second amount of heat that is less than the first amount of heat; and
    a heat sink mounted to the housing between the inlet end and the outlet end, with the heat sink comprising:
        a plate having a first section positioned adjacent to the first plurality of power transistors to draw the first amount of heat from the first plurality of power transistors and a second section positioned adjacent to the second plurality of power transistors to draw the second amount of heat from the second plurality of power transistors;
        a first plurality of fins extending from the first section of the plate to draw the first amount of heat from the first section;
        a second plurality of fins extending from the second section of the plate to draw the second amount of heat from the second section; and
        a guide vane extending directly from the plate between the first section and the second section, the guide vane oriented obliquely relative to the longitudinal axis,
    wherein the guide vane directs a first portion of the flow of coolant from the inlet end towards the first section to cool the first plurality of fins, and directs a second portion of the flow of coolant from the inlet end towards the second section to cool the second plurality of fins before the coolant exits the housing at the outlet end, wherein the first portion is larger than the second portion such that the first section receives more coolant than the second section.

2. The inverter assembly of claim 1, wherein the first plurality of fins are positioned on a first side of the longitudinal axis and the second plurality of fins are positioned on a second side of the longitudinal axis, and one end of the guide vane closest the inlet end is positioned on the second side of the longitudinal axis and an opposite end of the guide vane closest the outlet end is positioned on the first side of the longitudinal axis.

3. The inverter assembly of claim 2, wherein the guide vane is a non-linear flange extending from the plate.

4. The inverter assembly of claim 3, wherein the non-linear flange extending from the plate has an arcuate shape.

5. The inverter assembly of claim 2, wherein the guide vane is a linear flange extending from the plate and positioned at an angle relative to the longitudinal axis.

6. The inverter assembly of claim 2, wherein the plate further comprises a third section positioned downstream of the inlet end and upstream of the first and second sections of the plate, with the third section being free of the first plurality of fins and the second plurality of fins, and the end of the guide vane closest the inlet end is disposed at least partially within the third section.

7. The inverter assembly of claim 6, further comprising a third plurality of power transistors mounted to the housing and positioned adjacent to the third section of the plate, with third plurality of power transistors conducting and switching the electrical current and generating a third amount of heat that is less than the first amount of heat.

8. An inverter assembly for a motor vehicle, the inverter assembly comprising:

a housing having an inlet end for receiving a flow of coolant and an outlet end for discharging the flow of coolant from the housing, wherein the inlet end is disposed on the housing opposite the outlet end along a longitudinal axis of the housing;

a first plurality of power transistors mounted to the housing between the inlet end and the outlet end, with the first plurality of power transistors conducting and switching an electrical current and generating a first amount of heat;

a second plurality of power transistors mounted to the housing between the inlet end and the outlet end, with the second plurality of power transistors conducting and switching the electrical current and generating a second amount of heat that is less than the first amount of heat; and a heat sink mounted to the housing between the inlet end and the outlet end, with the heat sink comprising:

a plate having a first section positioned adjacent to the first plurality of power transistors to draw the first amount of heat from the first plurality of power transistors and a second section positioned adjacent to the second plurality of power transistors to draw the second amount of heat from the second plurality of power transistors;

a first plurality of fins extending from the first section of the plate to draw the first amount of heat from the first section, with each of the first plurality of fins having a frustum pin shape;

a second plurality of fins extending from the second section of the plate to draw the second amount of heat from the second section, with each of the second plurality of fins having the frustum pin shape; and a guide vane extending directly from the plate between the first section and the second section, the guide vane oriented obliquely relative to the longitudinal axis, wherein the guide vane directs a first portion of the flow of coolant from the inlet end towards the first section to cool the first plurality of fins, and directs a second portion of the flow of coolant from the inlet end towards the second section to cool the second plurality of fins before the coolant exits the housing at the outlet end, wherein the first portion is larger than the second portion such that the first section receives more coolant than the second section.

9. The inverter assembly of claim 8, wherein the frustum pin shape extends along a pin axis, and the frustum pin shape has a surface positioned at a draft angle in a range between 7 degrees and 9 degrees relative to the pin axis.

10. The inverter assembly of claim 9, wherein the first plurality of fins and the second plurality of fins are arranged in a staggered pattern relative to one another.

11. The inverter assembly of claim 10, wherein the first plurality of fins are positioned on a first side of the longitudinal axis and the second plurality of fins are positioned on a second side of the longitudinal axis, and one end of the guide vane closest the inlet end is positioned on the second side of the longitudinal axis and an opposite end of the guide vane closest the outlet end is positioned on the first side of the longitudinal axis.

12. The inverter assembly of claim 11, wherein the guide vane is a non-linear flange extending from the plate.

13. The inverter assembly of claim 12, wherein the non-linear flange extending from the plate has an arcuate shape.

14. The inverter assembly of claim 13, wherein the plate further comprises a third section positioned downstream of the inlet end and upstream of the first and second sections of the plate, with the third section being free of the first plurality of fins and the second plurality of fins, and the end of the guide vane closest the inlet end is disposed at least partially within the third section.

15. The inverter assembly of claim 14, further comprising a third plurality of power transistors mounted to the housing and positioned adjacent to the third section of the plate, with third plurality of power transistors conducting and switching the electrical current and generating a third amount of heat that is less than the first amount of heat.

16. A method, executed by a computer having a non-transitory computer readable storage medium storing instructions and at least one processor, of manufacturing an inverter assembly for a motor vehicle, the method comprising:

simulating, using the at least one processor, a virtual inverter assembly to determine a thermal performance of the virtual inverter assembly, with the virtual inverter assembly including:

a housing having an inlet end for receiving a flow of coolant and an outlet end for discharging the flow of coolant from the housing, wherein the inlet end is disposed on the housing opposite the outlet end along a longitudinal axis of the housing;

a first plurality of power transistors mounted to the housing between the inlet end and the outlet end, with the first plurality of power transistors conducting and switching an electrical current and generating a first amount of heat;

a second plurality of power transistors mounted to the housing between the inlet end and the outlet end, with the second plurality of power transistors conducting and switching the electrical current and generating a second amount of heat that is less than the first amount of heat; and a heat sink mounted to the housing between the inlet end and the outlet end, with the heat sink comprising:

a plate having a first section positioned adjacent to the first plurality of power transistors to draw the first amount of heat from the first plurality of power transistors and a second section positioned adjacent to the second plurality of power transistors to draw the second amount of heat from the second plurality of power transistors;

a first plurality of fins extending from the first section of the plate to draw the first amount of heat from the first section;

a second plurality of fins extending from the second section of the plate to draw the second amount of heat from the second section; and a guide vane extending directly from the plate between the first section and the second section, the guide vane oriented obliquely relative to the longitudinal axis, wherein the guide vane directs a first portion of the flow of coolant from the inlet end towards the first section to cool the first plurality of fins, and directs a second portion of the flow of coolant from the inlet end towards the second section to cool the second plurality of fins before the coolant exits the housing at the outlet end, wherein the first portion is larger than the second portion such that the first section receives more coolant than the second section;

determining, using the at least one processor, a temperature gradient between the first plurality of fins and the second plurality of fins;

comparing, using the at least one processor, the temperature gradient to a gradient threshold;

positioning, using the at least one processor, the guide vane at a new position based on the temperature gradient to form a new virtual inverter assembly, in response to the computer determining that the temperature gradient is above the gradient threshold;

simulating, using the at least one processor, the new virtual inverter assembly to determine the thermal performance of the new virtual inverter assembly, in response to the computer forming the new virtual inverter assembly; and forming the inverter assembly based on the new virtual inverter assembly in response to the computer determining that the temperature gradient is below the gradient threshold.

17. The method of claim 16, further comprising positioning, using the at least one processor, the guide vane at predetermined angular position relative to the longitudinal axis in response to the computer determining that the temperature gradient is above the gradient threshold.

18. The method of claim 17, further comprising:

comparing, using the at least one processor, a fin temperature of each of the fins, to a predetermined temperature threshold;

omitting, using the at least one processor, a third plurality of fins from a third section of the plate to form a new virtual inverter assembly, in response to the computer determining that the fin temperature of the associated fins is below the predetermined temperature threshold;

simulating, using the at least one processor, the new virtual inverter assembly to determine the thermal performance of the new virtual inverter assembly, in response to the computer forming the new virtual inverter assembly; and forming the inverter assembly based on the new virtual inverter assembly in response to the computer determining that the fin temperature of each of the first plurality of fins and the second plurality of fins is above the predetermined temperature threshold.

* * * * *